US010204828B1

(12) United States Patent
Bao et al.

(10) Patent No.: US 10,204,828 B1
(45) Date of Patent: Feb. 12, 2019

(54) ENABLING LOW RESISTANCE GATES AND CONTACTS INTEGRATED WITH BILAYER DIELECTRICS

(71) Applicant: International Business Machines Corporation, Armonk, NY (US)

(72) Inventors: Ruqiang Bao, Niskayuna, NY (US); Benjamin D. Briggs, Waterford, NY (US); Lawrence A. Clevenger, Saratoga Springs, NY (US); Koichi Motoyama, Clifton Park, NY (US); Cornelius Brown Peethala, Slingerlands, NY (US); Michael Rizzolo, Albany, NY (US); Gen Tsutsui, Glenmont, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/893,232

(22) Filed: Feb. 9, 2018

(51) Int. Cl.
*H01L 21/768* (2006.01)
*H01L 23/528* (2006.01)
*H01L 23/532* (2006.01)

(52) U.S. Cl.
CPC .. *H01L 21/76847* (2013.01); *H01L 21/76816* (2013.01); *H01L 23/528* (2013.01); *H01L 23/53266* (2013.01)

(58) Field of Classification Search
None
See application file for complete search history.

(56) References Cited

U.S. PATENT DOCUMENTS

| 7,326,656 | B2 | 2/2008 | Brask et al. |
| 7,432,200 | B2 | 10/2008 | Chowdhury et al. |
| 8,895,434 | B2 | 11/2014 | Ando et al. |
| 9,202,695 | B2 | 12/2015 | Togo |

(Continued)

OTHER PUBLICATIONS

K. Choi et al., "The effect of metal thickness, overlayer and high-k surface treatment on the effective work function of metal electrode," Proceedings of 35th European Solid-State Device Research Conference, ESSDERC 2005, Sep. 12-16, 2005, pp. 101-104.

(Continued)

*Primary Examiner* — Joseph Schoenholtz
(74) *Attorney, Agent, or Firm* — Vazken Alexanian; Otterstedt, Ellenbogen & Kammer, LLP

(57) ABSTRACT

A method for forming a semiconductor structure using first and second conductive materials, and having first and second trenches with first and second critical dimensions. The second conductive material exhibits a lower resistivity than the first conductive material at a film thickness corresponding to the second critical dimension and the second conductive material exhibits a higher resistivity than the first conductive material at a film thickness corresponding to the first critical dimension. An initial semiconductor structure has the first trench having the first critical dimension and the second trench having the second critical dimension. The second critical dimension is larger than the first critical dimension. A first conductive structure made from one of the first and second conductive materials is formed in the first trench. A second conductive structure made from another of the first and second conductive materials is formed in the second trench.

20 Claims, 10 Drawing Sheets

(56) References Cited

U.S. PATENT DOCUMENTS

| | | | |
|---|---|---|---|
| 9,330,939 B2 | 5/2016 | Zope et al. | |
| 9,379,221 B1 | 6/2016 | He et al. | |
| 9,418,982 B2* | 8/2016 | Deng | H01L 27/0288 |
| 9,437,714 B1 | 9/2016 | Adusumilli et al. | |
| 9,514,983 B2 | 12/2016 | Jezewski et al. | |
| 9,741,609 B1* | 8/2017 | Cheng | H01L 21/76847 |
| 9,881,798 B1 | 1/2018 | Adusumilli et al. | |
| 2013/0127055 A1* | 5/2013 | Chen | H01L 23/53238 |
| | | | 257/751 |
| 2016/0093616 A1 | 3/2016 | Lai et al. | |

OTHER PUBLICATIONS

L-Å. Ragnarsson et al., "RMG nMOS 1 st process enabling 10x lower gate resistivity in N7 bulk FinFETs," Symposium on VLSI Technology, 2015, pp. T148-T149.

Fred Lacy, Developing a theoretical relationship between electrical resistivity, temperature, and film thickness for conductors. Nanoscale Research Letters 2011, 6:636, p. 1-14.

* cited by examiner

NARROW TRENCH
901

WIDE TRENCH WILL HAVE ADDITIONAL DIELECTRIC
901

NARROW TRENCH
901

WIDE TRENCH
901

FIG. 19A 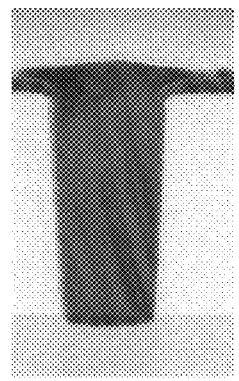 WETS ⇒ FIG. 19B 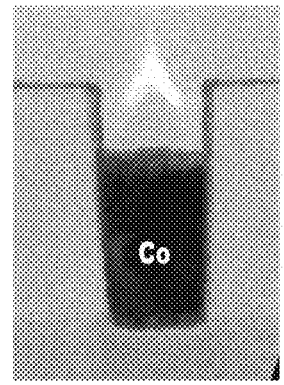
FIG. 20
COBALT WET ETCH SELECTIVE, NON-SELECTIVE,
AND REVERSE SELECTIVE TO TiN SUPPORTING DATA
| CHEMISTRY | Co ER, Å/min. | TiN (PVD) ER, Å/min. | Co/TiN SELECTIVITY |
|---|---|---|---|
| uDSP | 60 | <10 | > 6:1 |
| DCA lowO$_2$ | 20 | <2 | > 10:1 |
| dHF (800:1) | 17 | <10 | > 1:1 |
| T-Etch Gen2 | <1 | 125 | < 1:125 |
| COLD SC1 | <1 | <15 | < 1:15 |
| HOT SC1 | ~2 | ~50 | < 1:25 |
| TK10 | >100 | ~170 | > 1:1 |

ENABLING LOW RESISTANCE GATES AND CONTACTS INTEGRATED WITH BILAYER DIELECTRICS

BACKGROUND

The present invention relates generally to the electronic arts and, more particularly, to field-effect transistors, interconnect structures and their fabrication.

In highly scaled complementary metal oxide semiconductor (CMOS) technology, due to shrinking of the trench CD (critical dimension), the resistance obtained by using conventional material as the gate electrode, contact and/or interconnect material is dramatically increasing, thereby impacting device performance. The skilled artisan will appreciate that trenches are used, for example, in fabrication techniques employing replacement metal gate technologies and the like. During the replacement gate process, disposable gate structures are removed by at least one etch that is selective to the gate spacers and to the dielectric materials of a planarization dielectric layer. Cavities are formed from the spaces remaining after the disposable gate structures are removed. The semiconductor surfaces above the channel regions of the substrate can be physically exposed at the bottoms of the gate cavities, though native oxide layers may be present. The gate cavities are laterally enclosed by the gate spacers that were formed on the sidewalls of the disposable structures. Replacement gate structures are ordinarily formed in the gate cavities. Middle-of-line (MOL) processing includes the formation of source-drain contacts.

Silicon-based devices typically include multiple interconnect metallization layers above a device layer that contains field-effect transistors (FETs), memory devices, or other structures. The metallization layers often include high aspect ratio holes or vias that are relatively deep and have narrow diameters. The ratio of the depth to the diameter (aspect ratio) of contact holes is often much greater than one. Tungsten (W) is frequently employed as a fill material for contact holes having narrow (sub-micron) diameters. Tungsten fill material is deposited conformally using, for example, low pressure chemical vapor deposition (LPCVD). As the dimensions of tungsten metal contacts are scaled down for future technology nodes, currently used metallization techniques may not be able to deliver structures that meet the resistance targets required. The need for thick TiN liners to prevent fluorine diffusion and poor metal gap fill due to seams or other void types contribute to the high resistance of scaled-down tungsten contacts. Such liners reduce contact hole diameter and thereby displace metal conductor volume that could otherwise be deposited within the contact hole.

Currently employed conformal deposition processes for damascene tungsten involve the use of tungsten hexafluoride ($WF_6$) as a source material for the tungsten. The TiN liner protects the underlying titanium and silicon from the fluorine that is released during deposition. The process of filling high aspect ratio contact holes using conformal deposition processes often results in the formation of vertical seams within the metal contacts. Such seams are formed near the convergence of the tungsten-coated side walls of the contact holes. The seams also displace metal conductor volume and could lead to higher resistance.

Historical use of refractory metals and seams in Tungsten (W) metallization has prevented selective wet removal in wide lines. However, the advent of Cobalt (Co) in the middle-of-the-line (MOL) allows selective wet removal in wider lines.

New materials are being employed to use as the interconnects for highly scaled trenches (i.e. lowest CD trench). For example, Co and Ruthenium (Ru) are used as MOL interconnects in lieu of W. Another example is that Titanium nitride (TiN) fill only is used as a gate electrode in place of W or Aluminum (Al). (Note that TiN is usually employed as a liner for a subsequently deposited gate metal). It is pertinent to note that, at the atomic/molecular scale, resistivity is no longer a purely intrinsic property and varies based on the film thickness.

BRIEF SUMMARY

Techniques are disclosed for enabling low resistance gates and contacts integrated with bilayer dielectrics.

In one aspect, an exemplary method of forming a semiconductor structure is provided. The semiconductor structure uses first and second conductive materials, and has first and second trenches with first and second critical dimensions. The second conductive material exhibits a lower resistivity than the first conductive material at a film thickness corresponding to the second critical dimension and the second conductive material exhibits a higher resistivity than the first conductive material at a film thickness corresponding to the first critical dimension. The method includes providing an initial semiconductor structure having the first trench having the first critical dimension and the second trench having the second critical dimension, the second critical dimension being larger than the first critical dimension; forming in the first trench a first conductive structure made from one of the first and second conductive materials; and forming in the second trench a second conductive structure made from another of the first and second conductive materials.

In another aspect, an exemplary semiconductor structure includes an initial semiconductor structure defining a first trench having a first critical dimension and a second trench having a second critical dimension. The second critical dimension is at least one and one-half times larger than the first critical dimension. A first conductive structure is formed in the first trench and is made from one of a first conductive material and a second conductive material. A second conductive structure is formed in the second trench and is made from another one of the first conductive material and the second conductive material. The second conductive material exhibits a lower resistivity than the first conductive material at a film thickness corresponding to the second critical dimension and the second conductive material exhibits a higher resistivity than the first conductive material at a film thickness corresponding to the first critical dimension.

Techniques and devices as disclosed herein can provide substantial beneficial technical effects. By way of example only and without limitation, one or more embodiments may provide one or more of the following advantages:

ability to utilize new interconnect materials in the highly scaled trenches while utilizing conventional materials in the wider trenches, thereby advantageously obtaining relatively low resistance for both the highly scaled and wider trench structures.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 19A and 19B depict Co wet recessing; and

FIG. 20 is a table comparing Cobalt Wet Etch selective, non-selective, and reverse selective to TiN supporting data.

Figure 1A:
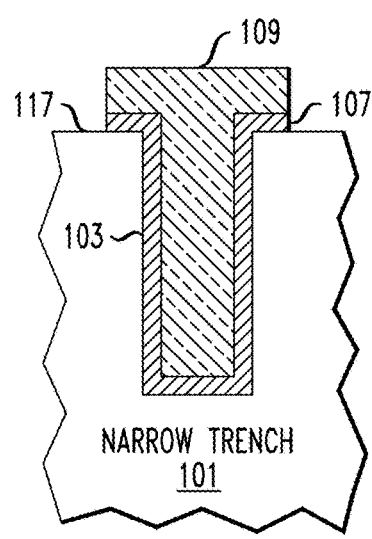
FIGS. 1A and 1B are cross-sectional views of, respectively, a narrow trench and a wide trench after TiN and Co deposition, in accordance with a first embodiment of the invention applicable, for example, to MOL.
Figure 1B:
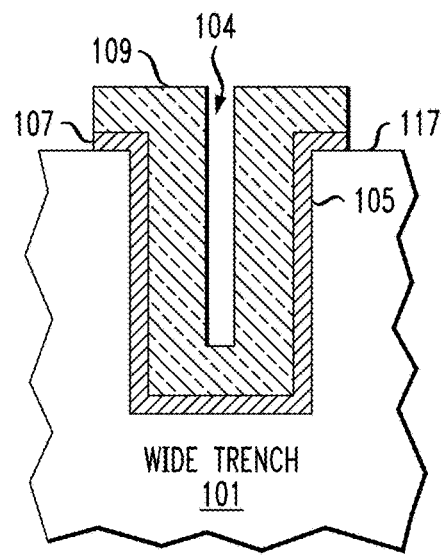

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of several illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

FIGS. 1A-17B schematically illustrate several exemplary sequences of fabrication steps that may be employed in obtaining low resistance gates and contacts integrated with bilayer dielectrics. Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. While some individual processing steps are set forth herein, those steps are merely illustrative, and one skilled in the art may be familiar with several equally suitable alternatives that would be applicable.

As noted, in highly scaled complementary metal oxide semiconductor (CMOS) technology, due to shrinking of the trench CD (critical dimension), the resistance obtained by using conventional material as the contact and/or interconnect is dramatically increasing, thereby impacting device performance. The skilled artisan will appreciate that trenches are used, for example, in fabrication techniques employing replacement metal gate technologies and the like.

Historical use of refractory metals and seams in Tungsten (W) metallization has prevented selective wet removal in wide lines. However, the advent of Cobalt (Co) in the middle-of-the-line (MOL) allows selective wet removal in wider lines.

New materials are being employed to use as the interconnects for highly scaled trenches (i.e. lowest CD trench). For example, Co and Ruthenium (Ru) are used as MOL interconnects to replace W. Another example is the use of Titanium nitride (TiN) fill as a gate electrode as opposed to a liner for a W or Aluminum (Al) gate electrode.

These new materials can offer lower resistance than conventional materials; however, they also result in higher resistance for the wider trenches (i.e. those trenches with larger CD). Therefore, performance will be affected if only the new materials are used when wide trenches are used in highly scaled CMOS technology.

One or more embodiments advantageously employ a wet etch to remove the new materials from the wide trench and then re-deposit the conventional low resistance materials to achieve lower resistance for both narrow trenches and wide trenches. Patterning can be carried out, for example, using an HM (hard mask) or without a HM patterning.

In one or more embodiments, the narrow trenches have metal layers different from those in the wide trenches in the same wafer or chip, so as to achieve relatively low resistance in both the narrow and wide trenches (not achievable by using other metal layers). For example, the newer materials can be employed in the narrow trenches and the conventional materials can be employed in the wider trenches, in one or more embodiments. In a non-limiting example, TiN/Co is employed in the narrow trench, but TiN/W is used in the wide trench in MOL applications. In another non-limiting example, TiN is used only in the narrow trench or gate, but W with a different TiN thickness is used in the wide trench.

In embodiments of the invention applied to replacement gate technology, different gate dielectrics can be used in the narrow trench and wide trench. A thinner and single dielectric layer can be used in the narrow trench, while thicker dual dielectric layers are employed in the wide trench.

With reference now to FIGS. 1A-4B, in a first embodiment, the wide lines have a different metal fill (e.g. W) as compared to the narrow lines (e.g. Co). This advantageously reduces the resistance in the wide lines while avoiding possible issues relating to the deposition of W in the narrow lines. In particular, as seen in FIGS. 1A and 1B, a narrow trench 103 and a wide trench 105 are formed in a structure 101. The structure 101 is known; for example; the structure can include an inter-layer dielectric (ILD) on top of a bulk silicon or silicon-on-insulator (SOI) substrate. The trenches could be formed, for example, in the ILD with the bottom of the trenches corresponding to the substrate in a well-known manner. Both the narrow trench 103 and wide trench 105 are formed in the same pre-existing structure 101; the broken lines are used to avoid cluttering the drawings with unnecessary detail. A TiN liner 107 is formed on the bottom and sides of the trenches 103, 105, and also extends across the outer surface 117 of the structure 101. The TiN liner may have a thickness of about ten to forty Angstroms (10-40 Å) in embodiments wherein a tungsten metallization is later employed and can be deposited using any suitable deposition process, for example, atomic layer deposition or sputtering. For illustrative convenience TiN liner 107 is not shown extending to the edges of the outer surface). Then a Co layer 109 is formed over the TiN liner 107. Chemical vapor deposition (CVD) may be employed for the selective deposition of metals such as tungsten, cobalt, ruthenium, rhodium, osmium, iridium and/or molybdenum. Cobalt deposited using techniques such as chemical vapor deposition may be able to significantly reduce seams and voids in MOL structures. The Co layer fills the narrow trench 103 but there is a gap 104 in the wide trench 105.

It should be noted that, given the teachings herein, the skilled artisan will be able to adapt known techniques for removal and deposition of various layers. Nevertheless, out of an abundance of caution, U.S. Pat. No. 8,895,434 of Ando et al. and U.S. Pat. No. 9,379,221 of He et al. are both expressly incorporated herein by reference in their entireties for all purposes. Note that the figures are not necessarily to scale and that the narrow and wide trenches are not necessarily parallel.

Figure 2A:
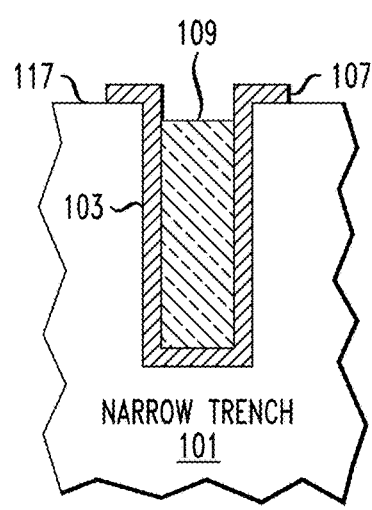
FIGS. 2A and 2B are cross-sectional views of, respectively, the narrow trench and wide trench of FIGS. 1A and 1B after selective Co etching, in accordance with the first embodiment of the invention.
Figure 2B:
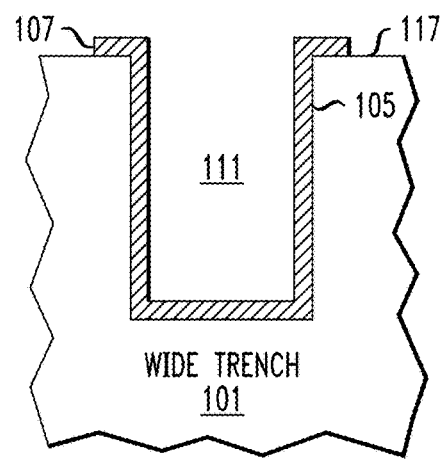

In FIGS. 2A and 2B, a Co wet etch is carried out, selective to the TiN (i.e., etchant attacks Co but has minimal effect on TiN). This results in all the Co being removed from the wide trench 105 yielding cavity 111, while most of the Co 109 remains within the narrow trench 103 with only a slight recessing, since the etchant has both a vertical and lateral path in the wide trench 105 due to seam 104, but only a vertical path in the narrow trench 103.

Figure 3A:
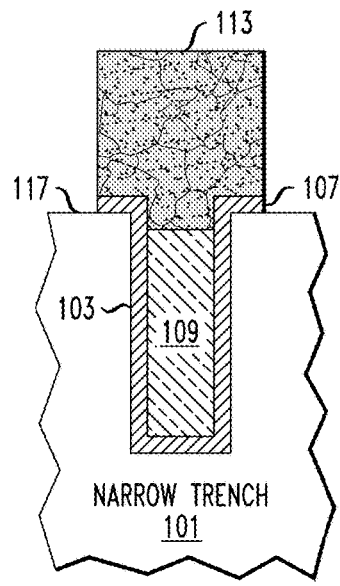
FIGS. 3A and 3B are cross-sectional views of, respectively, the narrow trench and wide trench of FIGS. 2A and 2B after selective W deposition, in accordance with the first embodiment of the invention.
Figure 3B:
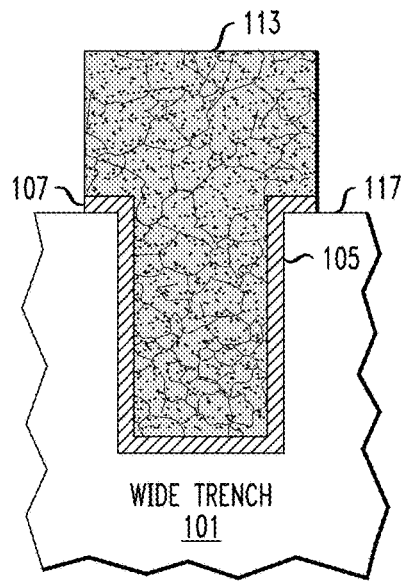
Figure 4A:
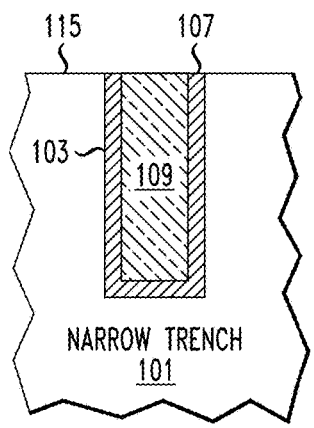
FIGS. 4A and 4B are cross-sectional views of, respectively, the narrow trench and wide trench of FIGS. 3A and 3B after chemical-mechanical polishing (CMP), in accordance with the first embodiment of the invention.
Figure 4B:
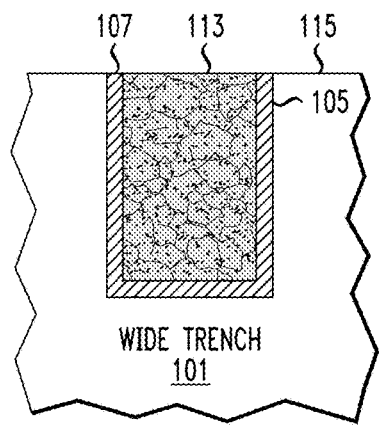

In FIGS. 3A and 3B, W 113 is deposited, filling the recess over the Co 109 in the narrow trench 103, filling the cavity 111, and extending over the liner 107 on the outer surface 117. A tungsten (W) layer may be deposited using a tungsten hexafluoride source with silane. Chemical vapor deposition conducted between 300-400° C. using tungsten hexafluoride precursor chemistry may, for example, be employed. Plasma enhanced CVD, thermal CVD, and atomic layer deposition are other possible options for depositing a conformal tungsten layer. In FIGS. 4A and 4B, chemical-mechanical polishing (CMP) is employed on the structure of FIGS. 3A and 3B, resulting in Co 109 only on the TiN liner in the narrow trench 103, W 113 only on the TiN liner in the wide trench 105, and removal of the W and TiN (metal overburden) from the outer surface 117 with recessing of the outer surface as seen at 115.

Figure 5A:
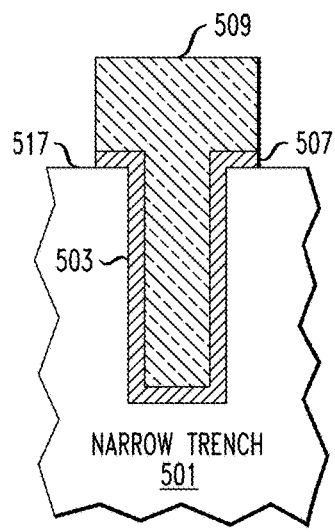
FIGS. 5A and 5B are cross-sectional views of, respectively, a narrow trench and a wide trench after TiN and Co deposition, in accordance with a second embodiment of the invention applicable, for example, to MOL.
Figure 5B:
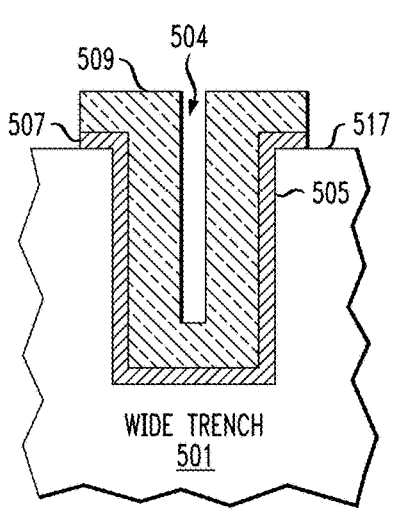

With reference now to FIGS. 5A-8B, in a second embodiment, the wide lines have a different metal fill (e.g. W) and a relatively thick liner as compared to the narrow lines (e.g. Co). Cobalt typically does not require relatively thick liners. For example, while 40 Å of titanium nitride (TiN) is typically necessary for tungsten metallization, 15-20 Å of TiN is typically sufficient for cobalt metallization. A thick liner can be used in the wide lines to reduce resistance and restrict "fluorine or other impurities" diffusion into the dielectric in the wide lines. In particular, as seen in FIGS. 5A and 5B, a narrow trench 503 and a wide trench 505 are formed in a structure 501, which can be similar to structure 101 discussed above. Both the narrow trench 503 and wide trench 505 are formed in the same pre-existing, monolithic structure 501; the broken lines are used to avoid cluttering the drawings with unnecessary detail. A TiN liner 507 is formed on the bottom and sides of the trenches 503, 505, and also extends across the outer surface 517 of the structure 501 (for illustrative convenience it is not shown extending to the edges of the outer surface). Then a Co layer 509 is formed over the TiN liner 507. The Co layer fills the narrow trench 503 but there is a gap 504 within the Co layer in the wide trench 505. The metallization process is stopped before the wide trench is entirely filled with Co.

Figure 6A:
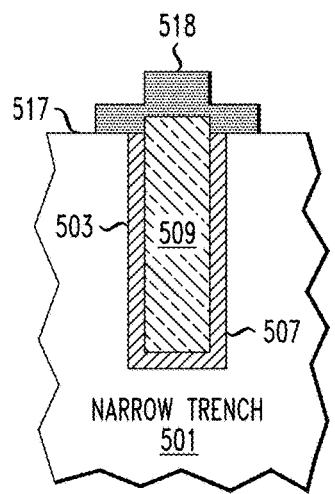
FIGS. 6A and 6B are cross-sectional views of, respectively, the narrow trench and wide trench of FIGS. 5A and 5B after Co and TiN etching and flash Physical vapor deposition (PVD) of Co, in accordance with the second embodiment of the invention.
Figure 6B:
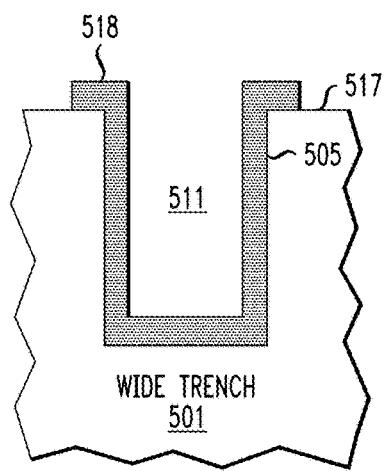

In FIGS. 6A and 6B, a Co and TiN wet etch is carried out, removing the Co and liner in the wide trench 505. This results in all the Co being removed from the wide trench 505 yielding cavity 511, while the TiN 507 remains lining the narrow trench 503 and the Co 509 remains within the narrow trench 503 and protrudes slightly. This is due to the lateral and vertical etch paths resulting from seam 504 in a similar manner to that discussed above. Flash PVD of additional Co 518 is then carried out, resulting in a Co layer in the wide trench 505 and a layer of Co covering the protruding Co 509 in the narrow trench 503.

Figure 7A:
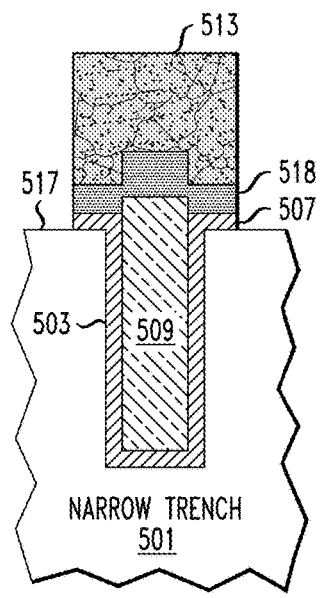
FIGS. 7A and 7B are cross-sectional views of, respectively, the narrow trench and wide trench of FIGS. 6A and 6B after W deposition, in accordance with the second embodiment of the invention.
Figure 7B:
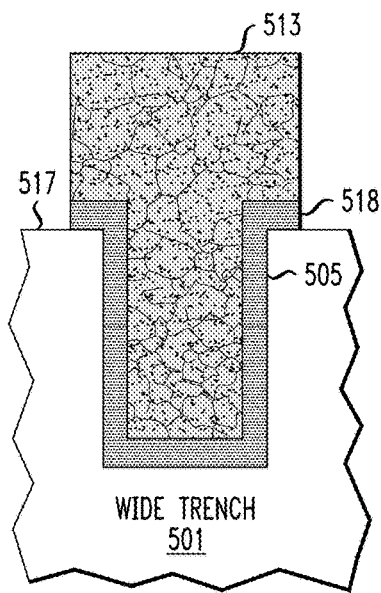
Figure 8A:
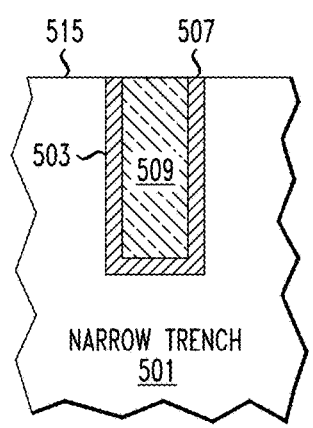
FIGS. 8A and 8B are cross-sectional views of, respectively, the narrow trench and wide trench of FIGS. 7A and 7B after chemical-mechanical polishing (CMP), in accordance with the second embodiment of the invention, depicting the resulting thin liner material in the narrow trench and thicker and/or different liner material in the wider trench.
Figure 8B:
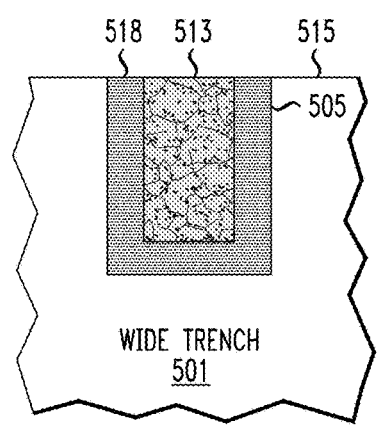

In FIGS. 7A and 7B, W 513 is deposited, covering over the Co 509 in the narrow trench 503, filling the cavity 511, and extending over the layer 518 on the outer surface 517. In FIGS. 8A and 8B, chemical-mechanical polishing (CMP) is employed on the structure of FIGS. 7A and 7B, resulting in Co 509 and TiN 503 in the narrow trench 503, W 513 and Co 518 in the wide trench 505, and removal of the W 513, Co 518, and TiN 507 from the outer surface 517 with recessing of the outer surface as seen at 515.

Figure 9A:
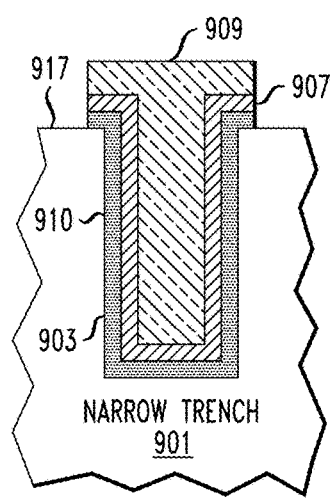
FIGS. 9A and 9B are cross-sectional views of, respectively, a narrow trench and a wide trench after TiN and Co deposition, in accordance with a third embodiment of the invention applicable, for example, to gate formation—note that the wide trench has additional dielectric.
Figure 9B:
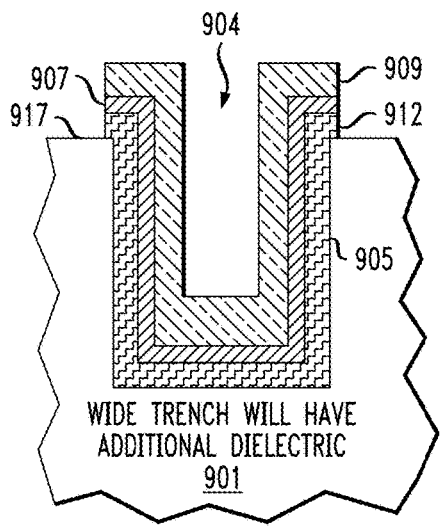

With reference now to FIGS. 9A-12B, in a third embodiment applicable to gates, the wide lines have a different metal fill (e.g. W) as compared to the narrow lines (e.g. Co). This advantageously reduces the resistance in the wide lines as compared to the case if they were fabricated with the same material as the narrow lines. In particular, as seen in FIGS. 9A and 9B, a narrow trench 903 and a wide trench 905 are formed in a structure 901. Both the narrow trench 903 and wide trench 905 are formed in the same pre-existing structure 901, for example by removing sacrificial material between dielectric spacers; the broken lines are used to avoid cluttering the drawings with unnecessary detail. Both the wide and narrow lines can be used for gate cavities (with different gate lengths), for example. In one or more embodiments, structure 901 is similar to structures 101, 501. Each trench is covered with a dielectric layer; the wide trench 905 has additional dielectric 912 as compared to the dielectric 910 of the narrow trench 903. A high-k gate dielectric layer is conformally deposited in the trenches following removal of sacrificial gate material. The thickness of the gate dielectric material can vary depending on the required device performance. Chemical vapor deposition or atomic layer deposition (ALD) can be employed for depositing a high-k dielectric material such as hafnium oxide. Other exemplary high-k dielectric materials include but are not limited to $ZrO_2$, $La_2O_3$, $Al_2O_3$, $TiO_2$, $SrTiO_3$, $LaAlO_3$, $Y_2O_3$, $HFO_xN_y$, $ZrO_xN_y$, $La_2O_xN_y$, $Al_2O_xN_y$, $TiO_xN_y$, $SrTiO_xN_y$, $LaAlO_xN_y$, and $Y_2O_xN_y$. The thickness of the gate dielectric may be in the range of 1.0 nm-5.0 nm in some exemplary embodiments. Post-deposition annealing (PDA) is conducted in accordance with conventional processing procedures. An etch-back process is employed to remove the gate dielectric material from the upper portions of the trenches. Plasma etching is among the techniques known for etching high-k dielectric materials such as hafnium oxide. Selected portions of the gate dielectric material in the lower portions of the recesses 26 can be protected by a mask (not shown) during the etch-back process. The etch-back of conformally deposited gate dielectric materials is known in the art.

In one or more embodiments, different gate dielectric materials can be used in the narrow and wide trenches; the skilled artisan can select appropriate materials with different work functions, given the teachings herein and the particular application. A TiN liner/barrier film layer 907 is formed on the bottom and sides of the trenches 103, 105 over the dielectric 910, 912 using an ALD process, and also extends across the outer surface 917 of the structure 901 (for illustrative convenience it is not shown extending to the edges of the outer surface). The barrier film layer may comprise multiple layers in some embodiments, including a work function material adjoining the trenches. Then a Co layer 909 is formed over the TiN liner 907. The Co layer fills the narrow trench 903 but there is a gap 904 in the Co layer in the relatively wide trench 905.

Figure 10A:
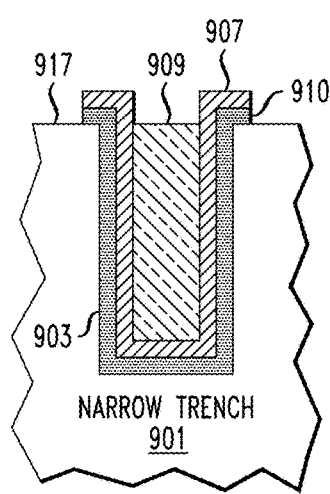
FIGS. 10A and 10B are cross-sectional views of, respectively, the narrow trench and wide trench of FIGS. 9A and 9B after Co etching, in accordance with the third embodiment of the invention.
Figure 10B:
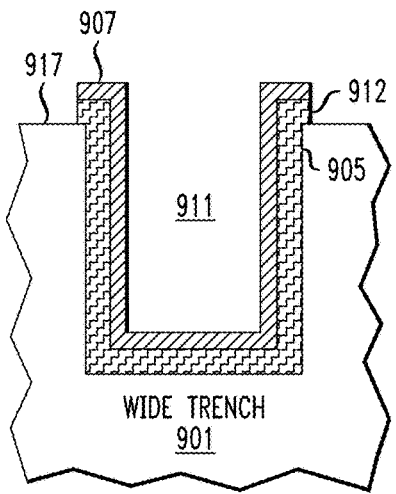

In FIGS. 10A and 10B, a Co wet etch is carried out. This results in all the Co being removed from the wide trench 905 yielding cavity 911, while most of the Co 909 remains within the narrow trench 903 with only a slight recessing; again, this is due to the lateral and vertical etch paths provided by seam 904, in a similar manner as discussed above.

Figure 11A:
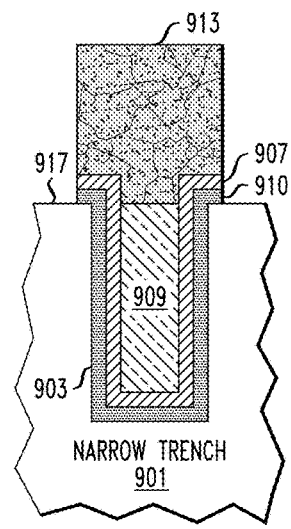
FIGS. 11A and 11B are cross-sectional views of, respectively, the narrow trench and wide trench of FIGS. 10A and 10B after W deposition, in accordance with the third embodiment of the invention.
Figure 11B:
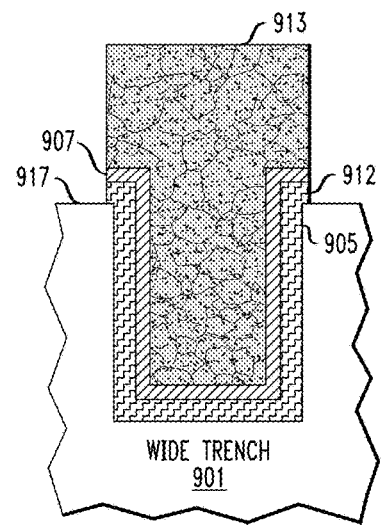
Figure 12A:
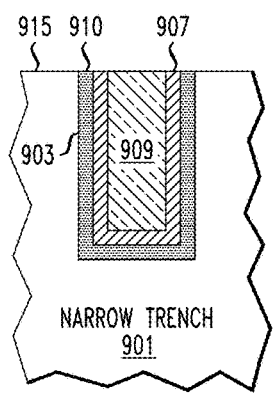
FIGS. 12A and 12B are cross-sectional views of, respectively, the narrow trench and wide trench of FIGS. 11A and 11B after chemical-mechanical polishing (CMP), in accordance with the third embodiment of the invention.
Figure 12B:
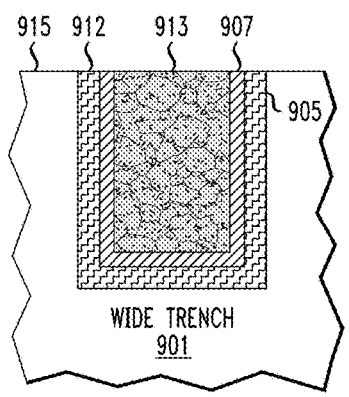

In FIGS. 11A and 11B, W 913 is deposited, filling the recess over the Co 909 in the narrow trench 903, filling the cavity 911, and extending over the liner 907 on the outer surface 917. In FIGS. 12A and 12B, chemical-mechanical polishing (CMP) is employed on the structure of FIGS. 11A and 11B, resulting in Co 909 and layers 907, 910 in the narrow trench 903, W 913 and layers 907, 912 in the wide trench 905, and removal of the W and TiN from the outer surface 917 with recessing of the outer surface as seen at 915.

Figure 13A:
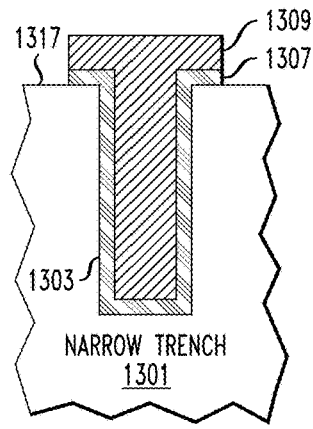
FIGS. 13A and 13B are cross-sectional views of, respectively, a narrow trench and a wide trench after TiN deposition, in accordance with a fourth embodiment of the invention applicable, for example, to gate formation.
Figure 13B:
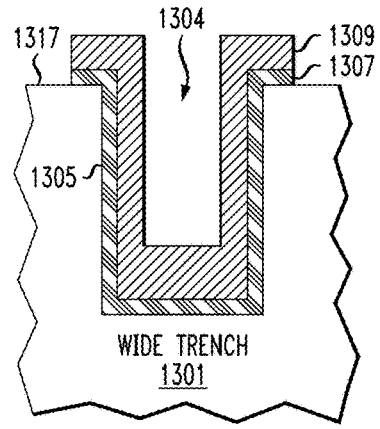

With reference now to FIGS. 13A-17B, in a fourth embodiment applicable to gates, the wide lines have additional dielectric liner 1397 and metal liner 1399, as discussed below. This advantageously reduces the gate leakage for wider gates in particular. The gate dielectric layer used in some devices may alternatively include a multi-layer of $SiO_2$, SiON, SiN, and a high-k dielectric material, including but not limited to hafnium oxide ($HfO_2$), aluminum oxide ($Al_2O_3$), lanthanum oxide ($La_2O_3$), zirconium oxide ($ZrO_2$), and their respective silicates. As seen in FIGS. 13A and 13B, a narrow trench 1303 and a wide trench 1305 are formed in a structure 1301. The structure 1301 can be similar to structure 101 as discussed above. Both the narrow trench 1303 and wide trench 1305 are formed in the same pre-existing structure 1301; the broken lines are used to avoid cluttering the drawings with unnecessary detail. Each trench is covered with a high-k dielectric layer 1307. A TiN layer 1309 is formed over the dielectric 1307, and also extends across the outer surface 1317 of the structure 1301 (for illustrative convenience it is not shown extending to the edges of the outer surface). The TiN layer 1309 fills the narrow trench 1303 but there is a gap 1304 in the wide trench 1305. Tantalum nitride (TaN) may alternatively be formed over the gate dielectric layer.

Figure 14A:
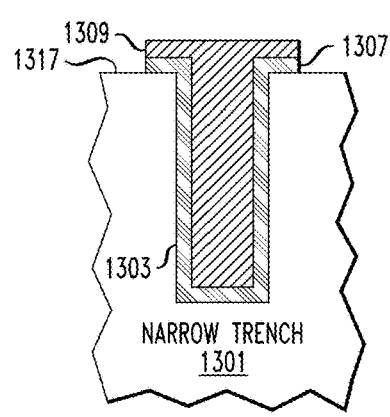
FIGS. 14A and 14B are cross-sectional views of, respectively, the narrow trench and wide trench of FIGS. 13A and 13B after TiN recessing, in accordance with the fourth embodiment of the invention.
Figure 14B:
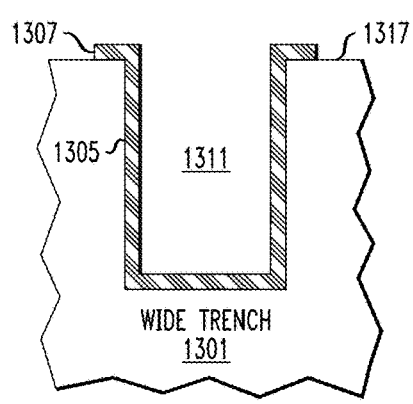

In FIGS. 14A and 14B, a TiN recess process is carried out; this results in all the TiN being removed from the wide trench 1305 yielding cavity 1311, while the TiN 1309, although recessed to some extent, remains within the narrow trench 1303. Again, this is due to the lateral and vertical etch paths provided by seam 1304, in a similar manner as discussed above.

Figure 15A:
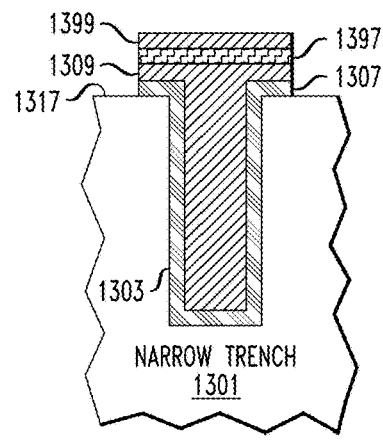
FIGS. 15A and 15B are cross-sectional views of, respectively, the narrow trench and wide trench of FIGS. 14A and 14B after dielectric and TiN liner deposition, in accordance with the fourth embodiment of the invention.
Figure 15B:
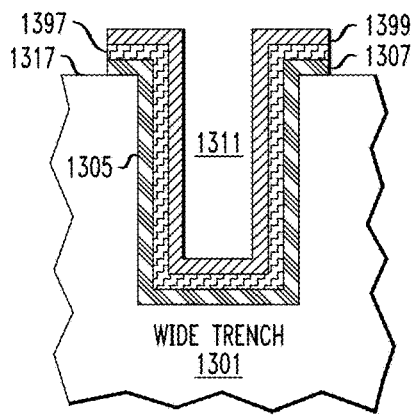
Figure 16A:
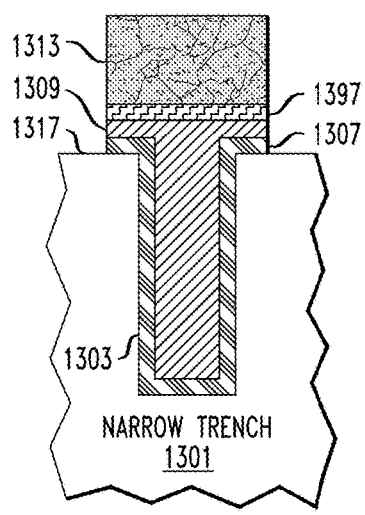
FIGS. 16A and 16B are cross-sectional views of, respectively, the narrow trench and wide trench of FIGS. 15A and 15B after TiN liner and W deposition, in accordance with the fourth embodiment of the invention.
Figure 16B:
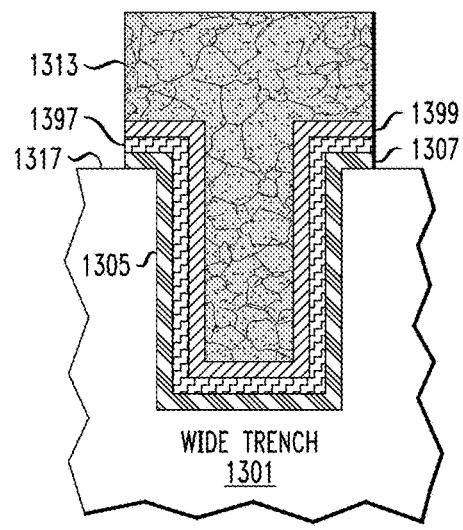
Figure 17A:
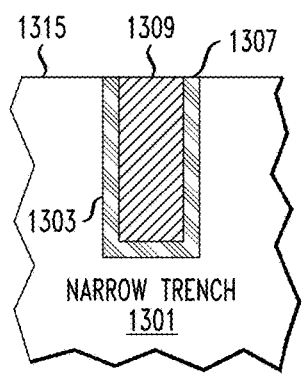
FIGS. 17A and 17B are cross-sectional views of, respectively, the narrow trench and wide trench of FIGS. 16A and 16B after chemical-mechanical polishing (CMP), in accordance with the fourth embodiment of the invention.
Figure 17B:
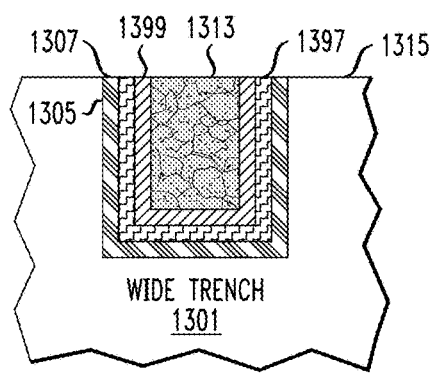

In FIGS. 15A and 15B, an additional dielectric layer 1397 is deposited, followed by a TiN liner 1399, covering the TiN 1309 over the narrow trench 1303, and lining the walls of the cavity 1311 of the wide trench 1305, and extending over the liner 1307 on the outer surface 1317. In FIGS. 16A and 16B, W 1313 is deposited, covering over the layer 1397 near the narrow trench 1303 (layer 1399 is removed over the narrow trench), filling the cavity 1311, and extending over the layer 1399 on the outer surface 1317. In FIGS. 17A and 17B, chemical-mechanical polishing (CMP) is employed on the structure of FIGS. 16A and 16B, resulting in TiN 1309 and high-k dielectric layer 1307 in the narrow trench 1303, and W 1313 and high-k dielectric layer 1307 in the wide trench 1305 with additional liners 1397, 1399, and removal of the W and liner layers from the outer surface 1317 with recessing of the outer surface as seen at 1315.

Figure 18:
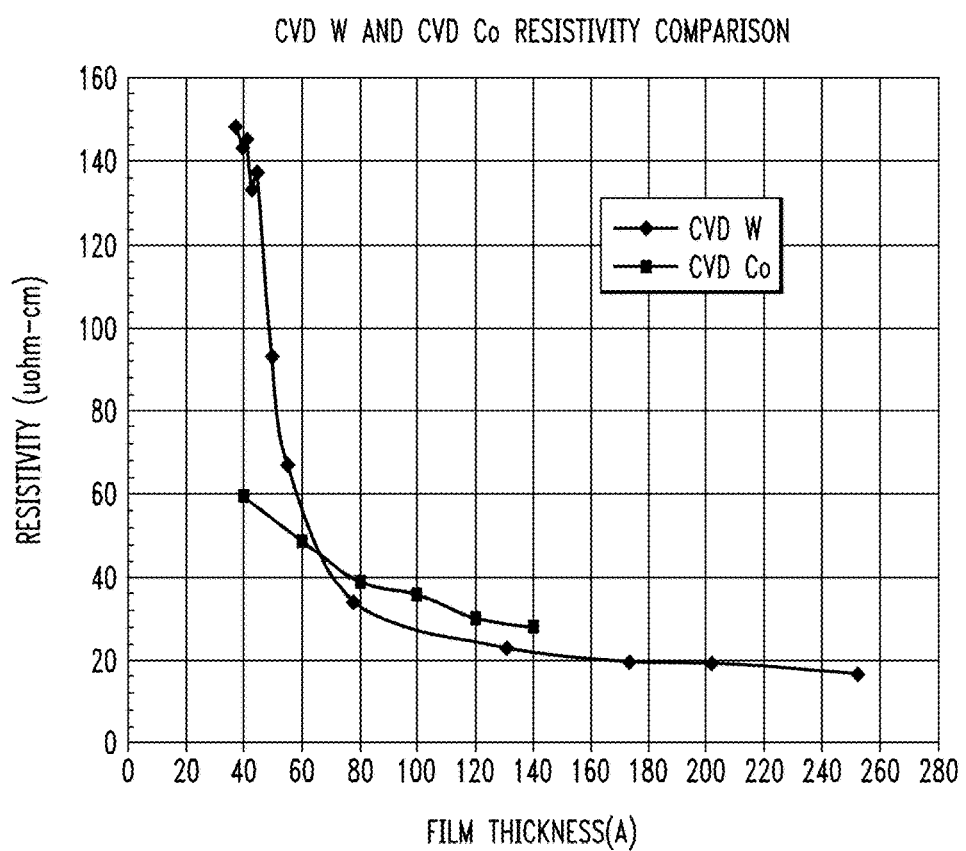
FIG. 18 is a graphical comparison of the resistivity in μΩ-cm versus film thickness in Angstroms for chemical vapor deposition (CVD) of Tungsten and of Cobalt.

FIG. 18 is a graphical comparison of the resistivity in µΩ-cm versus film thickness in Angstroms for chemical vapor deposition (CVD) of Tungsten and of Cobalt. Note that Co has a lower resistivity below about 67 Angstroms film thickness after which W has a lower resistivity. Embodiments are not limited to Co and W; they are merely non-limiting examples of materials wherein the resistivity of one material is lower than that of the other material below a certain film thickness, and higher above that thickness.

FIGS. 19A and 19B depict a trench filled with Co before (FIG. 19A) and after (FIG. 19B) a wet etching process.

The critical dimension (CD) for a trench is typically the width.

The table of FIG. 20 presents data for Co wet etching selective, non-selective, and reverse selective, as compared to TiN. The first column shows the chemistry of the etchant, the second column shows the etch rate for Co in Angstroms per minute, the third column shows the etch rate for TiN applied by physical vapor deposition (PVD) in Angstroms per minute, and the fourth column shows the selectivity (ratio of Co etch rate to TiN etch rate). The different etch chemistries listed in FIG. 20 are known to the skilled artisan.

It will be appreciated that materials other than those described herein can be employed in the fabrication of low resistance gates and contacts integrated with bilayer dielectrics.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching are well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more layers of a type commonly used in such integrated circuit devices may not be explicitly shown in a given figure for ease of explanation. This does not imply that the layer(s) not explicitly shown are omitted in the actual integrated circuit device.

Given the discussion thus far, it will be appreciated that, in general terms, an exemplary method is provided for forming a semiconductor structure using first and second conductive materials, and having first and second trenches with first and second critical dimensions. The second conductive material exhibits a lower resistivity than the first conductive material at a film thickness corresponding to the second critical dimension and the second conductive material exhibits a higher resistivity than the first conductive material at a film thickness corresponding to the first critical dimension. The method includes providing an initial semiconductor structure 101, 501, 901, 1301 having a first trench 103, 503, 903, 1303 having a first critical dimension and a second trench 105, 505, 905, 1305 having a second critical dimension larger than the first critical dimension. A further step includes forming in the first trench a first conductive structure made from the first or second conductive material (e.g., 109 in FIG. 4A; 509 in FIG. 8A; 909 in FIG. 12A; and 1309 in FIG. 17A). A still further step includes forming in the second trench a second conductive structure made from the other of the first or second conductive material (e.g., 113 in FIG. 4B; 513 in FIG. 8B; 913 in FIG. 12B; and 1313 in FIG. 17B). The conductive structures can include other layers as described herein, as well.

In one or more embodiments, the first conductive structure is made from the first conductive material and the second conductive structure is made from the second conductive material; however, this could be reversed if desired.

As noted, the second conductive material exhibits a lower resistivity than the first conductive material at a film thickness corresponding to the second critical dimension and the second conductive material exhibits a higher resistivity than the first conductive material at a film thickness corresponding to the first critical dimension. The required liners will also influence the resistance to some extent, since thicker liners will reduce the area available for conductive material, thus implying higher resistance.

In a non-limiting example, the first conductive material comprises Cobalt and the second conductive material comprises Tungsten.

In one or more embodiments, the step of forming the first conductive structure comprises depositing the first conductive material in the first and second trenches with a seam 104, 504, 904, 1304 present in the second trench but not the first trench; and the step of forming the second conductive structure comprises removing the first conductive material from the second trench by etching with both lateral and vertical etch paths on account of the seam, and depositing the second conductive material in the second trench.

In a non-limiting example, resultant structures in the MOL are contacts (e.g., for source/drain regions and/or gates). Other embodiments can be used for gates, e.g.

Note that in some instances, each trench can have the same liner. Note that in some instances, the second trench is formed with additional dielectric as compared to the first trench.

One or more embodiments include forming a liner (e.g. TiN 07, 507, 907) in the first and second trenches prior to depositing the first and second conductive materials.

In some instances (e.g., FIGS. 5A-8B), the step of forming the first conductive structure comprises depositing a first liner material 507 and the first conductive material 509 in the first and second trenches 503, 505 with a seam present in the second trench but not the first trench; and the step of forming the second conductive structure comprises removing the first conductive material and the first liner material from the second trench 505 by etching with both lateral and vertical etch paths on account of the seam, and depositing a second liner material 518 and the second conductive material 513 in the second trench 505.

The second trench can have a thicker and/or different liner material than the first trench. For example, in FIGS. 5A-8B the narrow trench 503 has a TiN liner and the wide trench 505 has a Co liner.

Referring to FIGS. 13A-17B, in some cases, the step of forming the first conductive structure comprises depositing the first conductive material 1309 in the first and second trenches; with a seam present in the second trench but not the first trench and the step of forming the second conductive structure comprises removing the first conductive material from the second trench 1305 by etching with both lateral and vertical etch paths on account of the seam, and depositing the second conductive material 1313 in the second trench. Furthermore, subsequent to removing the first conductive material from the second trench, a dielectric layer and a liner layer 1397, 1399 are deposited in at least the second trench, prior to depositing the second conductive material in the second trench.

Thus, in some embodiments (e.g. FIGS. 1A-4B), TiN/Co is in the narrow trench, but TiN/W is in the wide trench in MOL applications (1$^{st}$ embodiment). In other embodiments (e.g. FIGS. 13A-17B), TiN (and high-K) are in the narrow trench (gate applications), but W with different TiN thickness, dielectric layer (and high-K) are in the wide trench. Indeed, in one or more embodiments, different gate dielectrics are in the narrow trench and the wide trench. A thinner single dielectric layer is in the narrow trench 1303 with a thicker dual dielectric layer are in the wide trench 1305.

Given the teachings herein, the skilled artisan can form gates and or contacts from the final structures disclosed. In one or more embodiments, cobalt completely fills the narrow trench but does not completely fill the wide trench; the seam allows selectively etching all cobalt from the wide trench but leaving cobalt in the narrow trench.

The cobalt and tungsten can be exchanges in some instances; however one or more embodiments utilize a wide trench with a seam and a full narrow trench to permit the full removal by etching from the wide trench.

Furthermore, given the discussion thus far, it will be appreciated that, in general terms, an exemplary semiconductor structure includes an initial semiconductor structure 101, 501, 901, 1301 defining a first trench having a first critical dimension and a second trench having a second critical dimension. The second critical dimension is, for example, at least one and one-half times larger than the first critical dimension, in one or more embodiments. A first conductive structure is formed in the first trench and made from one of a first conductive material and a second conductive material; and a second conductive structure formed in the second trench and made from another one of the first conductive material and the second conductive material. The second conductive material exhibits a lower resistivity than the first conductive material at a film thickness corresponding to the second critical dimension and the second conductive material exhibits a higher resistivity than the first conductive material at a film thickness corresponding to the first critical dimension.

In one or more embodiments, the first conductive structure is made from the first conductive material and the second conductive structure is made from the second conductive material; however, this could be reversed if desired.

In some embodiments the first conductive material comprises Cobalt and the second conductive material comprises Tungsten.

Some embodiments further include a liner formed in the first and second trenches; in a non-limiting example, the liner comprises Titanium Nitride.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary devices illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having asymmetric transistors therein formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this invention is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" or adjoining another layer, it will be understood that there may or may not be intermediate elements or layers between the two specified layers. If a layer is described as "directly on" another layer, direct contact of the two layers is indicated.

The corresponding structures, materials, acts, and equivalents of means or step-plus-function elements, if any, in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical invention. It is submitted with the understanding that it will not be used to interpret or limit the scope or meaning of the claims. In addition, in the foregoing Detailed Description, it can be seen that various features are grouped together in a single embodiment for the purpose of streamlining the invention. This method of invention is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of forming a semiconductor structure using first and second conductive materials, and having first and second trenches with first and second critical dimensions, wherein said second conductive material exhibits a lower resistivity than said first conductive material at a film thickness corresponding to said second critical dimension and said second conductive material exhibits a higher resistivity than said first conductive material at a film thickness corresponding to said first critical dimension, said method comprising:
    providing an initial semiconductor structure having said first trench having said first critical dimension and said second trench having said second critical dimension, said second critical dimension being larger than said first critical dimension;
    forming in said first trench a first conductive structure made from one of said first and second conductive materials; and
    forming in said second trench a second conductive structure made from another of said first and second conductive materials.

2. The method of claim 1, wherein:
    in said step of forming said first conductive structure in said first trench, said first conductive structure is made from said first conductive material; and
    in said step of forming said second conductive structure in said second trench, said second conductive structure is made from said second conductive material.

3. The method of claim 2, wherein said first conductive material comprises Cobalt and said second conductive material comprises Tungsten.

4. The method of claim 2, wherein:
    said step of forming said first conductive structure comprises depositing said first conductive material in said first and second trenches with a seam present in said second trench but not said first trench; and
    said step of forming said second conductive structure comprises removing said first conductive material from said second trench by etching with both lateral and vertical etch paths on account of said seam, and depositing said second conductive material in said second trench.

5. The method of claim 4, wherein said first conductive material comprises Cobalt and said second conductive material comprises Tungsten.

6. The method of claim 5, further comprising forming a liner in said first and second trenches prior to depositing said first and second conductive materials.

7. The method of claim 6, wherein said liner comprises Titanium Nitride.

8. The method of claim 4, wherein said second trench is formed with additional dielectric as compared to said first trench.

9. The method of claim 2, wherein:
    said step of forming said first conductive structure comprises depositing a first liner material and said first conductive material in said first and second trenches with a seam present in said second trench but not said first trench; and
    said step of forming said second conductive structure comprises removing said first conductive material and said first liner material from said second trench by etching with both lateral and vertical etch paths on account of said seam, and depositing a second liner material and said second conductive material in said second trench.

10. The method of claim 9, wherein said first conductive material comprises Cobalt and said second conductive material comprises Tungsten.

11. The method of claim 9, wherein said first and second liner materials are different.

12. The method of claim 9, wherein said first and second liner materials form respective first and second liners having different thicknesses, said second liner being thicker than said first liner.

13. The method of claim 12, wherein said first and second liner materials are identical.

14. The method of claim 12, wherein said first and second liner materials are different.

15. The method of claim 2, wherein:
    said step of forming said first conductive structure comprises depositing said first conductive material in said first and second trenches with a seam present in said second trench but not said first trench; and
    said step of forming said second conductive structure comprises removing said first conductive material from said second trench by etching with both lateral and vertical etch paths on account of said seam, and depositing said second conductive material in said second trench;
    further comprising, subsequent to removing said first conductive material from said second trench, depositing a dielectric layer and a liner layer in at least said second trench, prior to depositing said second conductive material in said second trench.

16. A semiconductor structure comprising:
an initial semiconductor structure defining a first trench having a first critical dimension and a second trench having a second critical dimension, said second critical dimension being at least one and one-half times larger than said first critical dimension;
a first conductive structure formed in said first trench and made from one of a first conductive material and a second conductive material; and
a second conductive structure formed in said second trench and made from another one of said first conductive material and said second conductive material;
wherein said second conductive material exhibits a lower resistivity than said first conductive material at a film thickness corresponding to said second critical dimension and said second conductive material exhibits a higher resistivity than said first conductive material at a film thickness corresponding to said first critical dimension.

17. The structure of claim 16, wherein:
said first conductive structure is made from said first conductive material; and
said second conductive structure is made from said second conductive material.

18. The structure of claim 17, wherein said first conductive material comprises Cobalt and said second conductive material comprises Tungsten.

19. The structure of claim 18, further comprising a liner formed in said first and second trenches.

20. The structure of claim 19, wherein said liner comprises Titanium Nitride.

* * * * *